US012740377B2

(12) United States Patent
Hagmann et al.

(10) Patent No.: US 12,740,377 B2
(45) Date of Patent: Sep. 15, 2026

(54) SUBSTRATE SUPPORT UNIT, AND APPARATUS AND METHOD FOR DEPOSITING A LAYER USING THE SAME

(71) Applicant: EVATEC AG, Trübbach (CH)

(72) Inventors: Florian Hagmann, Grabs (CH); Klaus Mündle, Feldkirch (AT); Andreas Mark, Wangs (CH)

(73) Assignee: EVATEC AG, Trübbach (CH)

( * ) Notice: Subject to any disclaimer, the term of this patent is extended or adjusted under 35 U.S.C. 154(b) by 973 days.

(21) Appl. No.: 17/754,560

(22) PCT Filed: Sep. 8, 2020

(86) PCT No.: PCT/EP2020/075071
§ 371 (c)(1),
(2) Date: Apr. 6, 2022

(87) PCT Pub. No.: WO2021/069167
PCT Pub. Date: Apr. 15, 2021

(65) Prior Publication Data
US 2024/0063051 A1 Feb. 22, 2024

(30) Foreign Application Priority Data
Oct. 8, 2019 (CH) .................................... 01276/19

(51) Int. Cl.
*H10P 72/76* (2026.01)
*C23C 14/50* (2006.01)
(Continued)

(52) U.S. Cl.
CPC ........ *H10P 72/7618* (2026.01); *C23C 14/505* (2013.01); *C23C 16/4581* (2013.01);
(Continued)

(58) Field of Classification Search
None
See application file for complete search history.

(56) References Cited

U.S. PATENT DOCUMENTS 4,358,753 A * 11/1982 Cascini .................. H03M 1/30 341/2
4,585,337 A * 4/1986 Phillips ................ G03F 9/7026 355/72

(Continued)

FOREIGN PATENT DOCUMENTS

CN 101512041 A 8/2009
DE 102012104475 A1 11/2013

(Continued)

OTHER PUBLICATIONS

International Search Report and Written Opinion for PCT/EP2020/075071 dated Dec. 8, 2020.

*Primary Examiner* — Keath T Chen
*Assistant Examiner* — Margaret Klunk
(74) *Attorney, Agent, or Firm* — McDonald Hopkins LLC

(57) ABSTRACT

A substrate support unit including a turntable which is rotatable around a first axis and which is driven by a first drive. A plurality of substrate carrier units are arranged concentric to the first axis on the turntable. Each of the plurality of substrate carrier units includes a substrate carrier which is rotatable around a corresponding second axis and which is driven by a second drive, wherein all second axes are parallel to the first axis.

19 Claims, 5 Drawing Sheets

(51) Int. Cl.
*C23C 16/458* (2006.01)
*H10P 72/50* (2026.01)

(52) U.S. Cl.
CPC .......... *H10P 72/50* (2026.01); *H10P 72/7612* (2026.01); *H10P 72/7621* (2026.01)

(56) References Cited

U.S. PATENT DOCUMENTS

| | | | | |
|---|---|---|---|---|
| 5,782,979 | A * | 7/1998 | Kaneno | C30B 25/12 118/728 |
| 2003/0029384 | A1* | 2/2003 | Nishikawa | C23C 16/4584 156/345.55 |
| 2007/0158583 | A1* | 7/2007 | Cho | H01L 21/68771 250/492.21 |
| 2010/0055312 | A1* | 3/2010 | Kato | C23C 16/45508 118/668 |
| 2010/0124610 | A1* | 5/2010 | Aikawa | C23C 16/4584 118/712 |
| 2010/0258432 | A1* | 10/2010 | Ernult | C23C 14/351 204/192.12 |
| 2012/0002216 | A1 | 1/2012 | Shibata et al. | |
| 2012/0145080 | A1 | 6/2012 | Park et al. | |
| 2014/0345523 | A1* | 11/2014 | Kikuchi | C23C 16/52 118/712 |
| 2016/0122872 | A1* | 5/2016 | Kato | H01L 21/68764 118/712 |
| 2016/0177450 | A1* | 6/2016 | Kanno | C23C 16/46 427/535 |
| 2016/0197001 | A1* | 7/2016 | Samir | C23C 16/44 118/623 |
| 2017/0032992 | A1 | 2/2017 | Hoechbauer | |
| 2017/0241018 | A1* | 8/2017 | Oyama | C23C 16/455 |
| 2018/0037990 | A1* | 2/2018 | Kato | C23C 16/345 |
| 2018/0214915 | A1* | 8/2018 | Butterbaugh | B08B 3/024 |
| 2018/0251892 | A1* | 9/2018 | Kobayashi | C23C 16/4584 |
| 2018/0334745 | A1* | 11/2018 | Kato | H01L 21/68771 |
| 2019/0186004 | A1* | 6/2019 | Kato | H01L 21/68764 |
| 2020/0056284 | A1* | 2/2020 | Mitrovic | H01L 21/68785 |
| 2020/0126836 | A1* | 4/2020 | Yoon | H01R 39/26 |
| 2021/0071302 | A1* | 3/2021 | Tanaka | C23C 16/483 |

FOREIGN PATENT DOCUMENTS

| | | | |
|---|---|---|---|
| EP | 1415017 | B1 | 4/2007 |
| JP | S63266072 | A | 11/1988 |
| JP | 2004055636 | A | 2/2004 |
| JP | 2010214533 | A | 9/2010 |
| WO | 2003014414 | A1 | 2/2003 |
| WO | 2007117305 | A2 | 10/2007 |

* cited by examiner

SUBSTRATE SUPPORT UNIT, AND APPARATUS AND METHOD FOR DEPOSITING A LAYER USING THE SAME

TECHNICAL FIELD OF THE INVENTION

The current invention relates to substrate support units and apparatuses and methods for depositing a thin film using the same and, more particularly, to a substrate support unit configured to support a plurality of substrates and an apparatus and a method for depositing a thin film on the substrates using the same.

DESCRIPTION OF THE RELATED ART

In general, semiconductor devices are manufactured through various processes such as, for example, a deposition process, a photolithography process, an etching process, and a cleaning process. Among these processes, the deposition process is performed to form a material layer on a substrate. The deposition process includes, for example, a physical vapor deposition (PVD) process, a chemical vapor deposition (CVD) process, an atomic layer deposition (ALD) process, and so forth.

For example, US 2012/0145080 discloses a substrate support unit with a rotation plate and a plurality of substrate carriers rotatably mounted on the rotation plate, wherein a single drive is driving the rotation of the rotation plate and the rotation of the substrate carriers on the rotation plate. Such a concept is complex and thus, involves extensive maintenance. As all the substrate carriers are rigidly coupled to one another, it is very complex and time-consuming to adjust an individual substrate carrier, especially when only one substrate carrier needs replacement.

SUMMARY OF THE INVENTION

In the current invention, it is therefore a task to be solved to provide a table support which allows an easy maintenance, i.e. replacement of substrate carriers and which is more accurate with respect to the positioning of each of the substrate carriers.

This task is solved by a substrate support unit with the features of claim 1. Further embodiments of the substrate support unit, an apparatus and a method for depositing a thin film on a substrate using said substrate support unit are defined by the features of further claims.

A substrate support unit according to the invention comprises a turntable which is rotatable around a first axis and which is driven by a first drive, a plurality of substrate carrier units which are arranged concentric to the first axis on the turntable, each comprising a substrate carrier which is rotatable around a corresponding second axis and which is driven by a second drive, wherein all second axes are parallel to the first axis.

With such a design, each substrate carrier can be oriented independently from the turntable, as well as from each other. Additionally, the replacement of one substrate carrier unit is easy and there is no need for synchronizing the orientation of the replaced substrate carrier with the orientation of the other substrate carriers. Thus, reducing the replacement effort. The substrates to be coated can be placed directly on the rotatable carrier. It is also possible to position the substrates on an intermediate carrier and place the intermediate carrier together with the mounted substrate on the rotatable carrier.

In one embodiment, the second drive is vacuum suitable. Such a drive can be installed much closer to the substrate carriers. With a shorter transmission distance, the accuracy of the positioning of the substrate carriers can be increased. A drive suitable for vacuum requires a degassing process and requires components with a higher temperature resistance. Additionally, if the drive is suitable for vacuum, there is no need for a complex power transmission from the ambient to the vacuum.

In one embodiment, the first drive and/or the second drive is a stepper motor. Alternatively, the first drive and/or the second drive can be a servo drive. If a position determination is required, operating a stepper motor requires fewer electric cables than a servo drive.

In one embodiment, the turntable comprises a disk-shaped upper table plate with a plurality of holes for receiving one substrate carrier unit, wherein all holes are arranged concentric to the first axis on a common diameter. With such a design, it is possible to arrange a substrate carrier unit in all holes or one or more of the holes can be closed by a cover. The holes can be evenly or unevenly distributed around the circumference of the turntable.

In one embodiment, each substrate carrier unit comprises a housing in which the second drive is received and with which each substrate carrier unit is arranged in the corresponding hole of the turntable. If a substrate carrier unit needs to be replaced, it can be easily removed together with the housing, which reduces the downtime.

In one embodiment, a mounting flange is arranged slidably along the second axis on a first shaft of the second drive, wherein the first shaft protrudes a top surface of the housing. With the mounting flange, the vertical position of the substrate carrier can be adjusted. The top surface of the housing extends perpendicular to the first shaft and is essentially flush with a top surface of the upper table plate.

In one embodiment, an insulator is arranged between the mounting flange and the substrate carrier. The insulator reduces the thermal stress on the mounting flange and therefore on the second drive.

In one embodiment, a position detection system is arranged on the second drive on the side opposite to the first shaft. A position flag is arranged on a second shaft of the second drive. The second shaft is colinear to the first shaft and exits the second drive on its side opposite to the first shaft. The position flag is disk-shaped, extends beyond the width of the second drive and comprises at least one opening that extends over a part of the circumference of the part of the disk that extends beyond the width of the second drive. A reflector is arranged in the housing of the substrate carrier unit adjacent to the second drive, the reflector is arranged essentially perpendicular to the connecting line of the first axis and the corresponding second axis, is oriented parallel to the second axis and faces the position flag.

In one embodiment, an upper shield is arranged around the substrate carriers, covering a top surface of the turntable, wherein a top surface of the upper shield is essentially flush with the top surface of the substrate carriers. The shield has lightweight design, reduces the thermal load on the turntable and prevents the turn table from being coated during operation. The shield can be easily replaced and can be easily cleaned off site.

In one embodiment, a lower table plate is arranged below the second drives extending over the entire circumference of the turntable. The lower table plate protects the substrate carrier units from the side opposite to the upper table plate.

In one embodiment, a substrate lift is arranged at each substrate carrier. The substrates or the substrates together with an intermediate carrier can be lifted from and lowered to the substrate carrier. For example, the substrate lift comprises pins, with which the substrates can be lifted directly or with which the intermediate carrier can be lifted. With three pins, independent from its planeness, the substrate or the intermediate carrier are always positioned stable on the pins.

In one embodiment, a lifter is arranged below the turntable at a substrate loading position. The lifter is designed to engage each substrate lift that is allocated in the substrate loading position. With this, only one lifter, i.e. actuator is needed for all the substrate lifts. Alternatively, instead of having a substrate lift and a lifter, a loading robot can be used. The loading robot being able to transfer a substrate or an intermediate carrier with a substrate to the rotatable substrate carrier by executing horizontal and vertical movements. The horizontal movements can be linear movements and/or pivotal movements.

In one embodiment, a laser sensor is arranged below the turntable at the substrate loading position. The laser is positioned essentially perpendicular to the connecting line of the first axis and the corresponding second axis and is oriented parallel to the second axis and faces the position flag. The distance from the laser sensor to the connecting line is identical to the distance from the reflector to the connection line. With this arrangement of the laser sensor and the reflector, the highest accuracy of the position of the substrate carrier in the substrate loading position can be achieved. However, other positions of the laser sensor and the reflector could also be realized.

In one embodiment, at least two of the second drives are electrically connected in series. With this, the number of required electric cables can be reduced. Less electric cables are desirable as all cables need to be guided from the rotating turntable to a stationary base. The less cables, the fewer rotary feedthroughs are required.

In one embodiment, the substrate support unit comprises a control unit that is arranged in an atmospheric and static place, wherein each series of second drives is connected to the control unit by means of a vacuum feedthrough and a rotary feedthrough. Such a design is less demanding than a vacuum rotary feedthrough with respect to tightness.

In one embodiment, each second drive comprises a temperature sensor. The temperature sensor of one second drive of each series of second drives is connected to the control unit. Like so, the number of electric cables that need to pass the rotary feedthrough can be reduced. For example, if that there are two, three, four or five second drives electrically connected in series, each second drive comprises a temperature sensor, but only one of these temperature sensors is connected to the control unit.

The features of the above-mentioned embodiments of the substrate support unit can be used in any combination, unless they contradict each other.

An apparatus according to the invention for depositing a thin film on a substrate, comprises a process chamber, at least one source on a first side of the process chamber and a substrate support unit according to one of the preceding embodiments. The substrate support unit defines a second side of the process chamber, opposite to the first side of the process chamber. The substrate support unit can define a lower side and the source can be arranged at an upper side or vice versa. It would also be possible to have an arrangement where the axis of the turntable is oriented horizontally and thus, the substrate support unit would define one lateral side of the process chamber and the source would define an opposing lateral side.

In one embodiment, the apparatus comprises a transfer module that is arranged at the substrate loading position of the substrate support unit and at least one loading module that is arranged at the transfer module on the opposite side of the substrate support unit. It is also possible to have two or more loading modules that are arranged next to each other on the opposite side of the substrate support unit. In a loading module, single substrates or a batch of substrates can be arranged, with or without an intermediate carrier. The transfer module can transfer the substrates or the intermediate carriers together with the carried substrate from the at least one loading module to the substrate loading position or into the process chamber directly.

A process according to the invention for depositing a thin film on a substrate, comprises the steps of:

- providing a substrate support unit according to one of the preceding embodiments;
- providing a process chamber with at least one source on a first side of the process chamber, wherein the substrate support unit defines a second side of the process chamber, opposite to the first side of the process chamber;
- arranging one of the substrate carrier units in the substrate loading position with the first drive;
- orienting the substrate carrier of said substrate carrier unit in the substrate loading position with the corresponding second drive;
- loading a substrate on said substrate carrier;
- rotating the first drive while passing the area of influence of the at least one source for depositing an oriented thin film on the loaded substrate or
- rotating the first drive and the second drive while passing the area of influence of the at least one source for depositing a non-oriented thin film on the loaded substrate.

BRIEF DESCRIPTION OF THE DRAWINGS

Embodiments of the current invention are described in more detail in the following with reference to the figures. These are for illustrative purposes only and are not to be construed as limiting. It shows FIG. 1 a partial cross-sectional view of an apparatus for depositing a thin film on a substrate with a substrate support unit according to the invention.

DETAILED DESCRIPTION OF THE INVENTION

Figure 1:
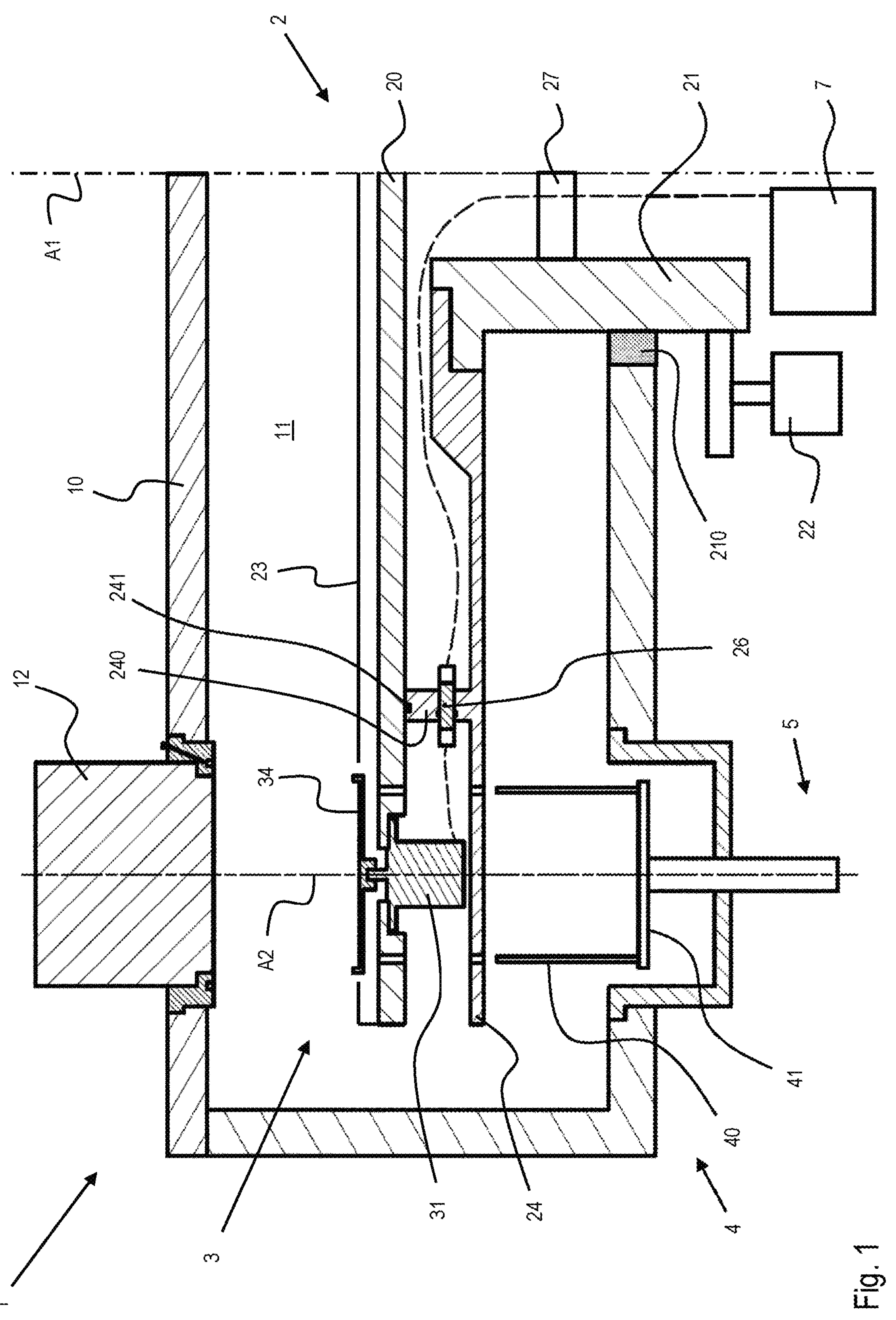
Figure 2:
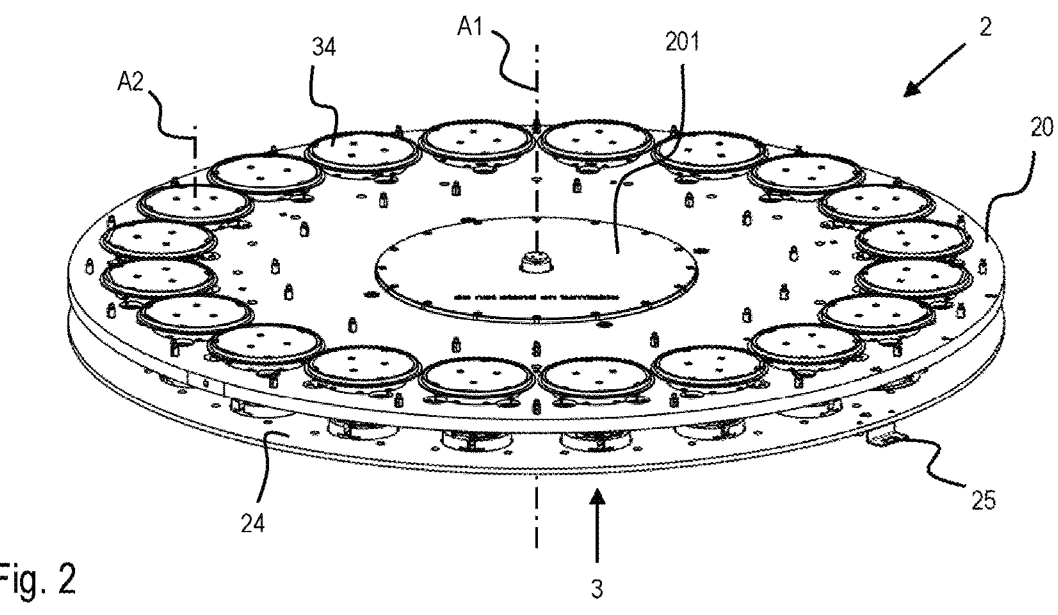
FIG. 2 a perspective view from above of the turntable of FIG. 1.

FIG. 1 shows partial cross-sectional view of an apparatus 1 for depositing a thin film on a substrate with a substrate support unit according to the invention and FIG. 2 shows a perspective view from above of a turntable 2 of FIG. 1. The apparatus 1 comprises a housing 10 that defines a process chamber at least on an upper side and on the lateral sides. In the depicted embodiment, the turntable 2 is arranged in the process chamber 11, at least partially. The turntable 2 is arranged tight and rotatable around a first axis A1 in the housing 10. A vacuum can be realized in the process chamber 11. The table shaft 21 of the turntable 2 is mounted on the housing 10 with a tight bearing 210. The turntable 2 further comprises an upper table plate 20 and a lower table plate 24, wherein the lower table plate 24 is connected to the table shaft 21 and the upper table plate 20 is connected to the lower table plate 24. Both table plates are arranged completely within the process chamber 11. The upper table plate 20 and the lower table plate 24, both have the shape of a circular disk. The upper table plate 20 rests on a circular wall 240, which extends essentially perpendicular from the upper surface of the lower table plate 24. A sealing 241 is arranged between the upper surface of the circular wall and the lower surface of the upper table plate 20. On the upper table plate 20, several substrate carrier units 3 are arranged evenly distributed around its circumference or around the first axis A1, respectively. Each substrate carrier unit 3 comprises at least a substrate drive 31 and a substrate carrier 34. The substrate carrier 34 is arranged on the substrate drive 31 and is rotatable around a second axis A2. At the same lateral distance to the first axis A1 as each substrate carrier unit 3, at least one source 12 for coating a substrate is arranged on the housing 10 as such that one side of the source 12 faces the substrate carrier 34. The substrate carrier units 3 can pass below the sources 12 when the turntable 2 is rotated. On the upper side of the upper table plate 20, an upper shield 23 is arranged, surrounding the substrate carrier 34 and completely covering the upper surface of the upper table plate 20. As the substrate carriers 34 are circular disks, the cut-outs in the upper shield 23 are correspondingly circular. There is a small clearance between the lateral side of each substrate carrier disk 23 and the corresponding cut-out. Each substrate carrier unit 3 is electrically connected to a control unit 7 by means of electric cables. The electric cables passing a vacuum feedthrough 26 and a rotary feedthrough 27, the vacuum feedthrough 26 of each substrate carrier unit 3 is arranged in the circular wall 240, separating the process chamber 11 from the surrounding atmosphere. The common rotary feedthrough 27 for all substrate carrier units 3 is arranged in the inside of the table shaft 21. The turntable 2 can be rotated by means of a table drive 22 engaging the table shaft 21. At the loading/unloading position, a substrate lift 4 and a lifter 5 are arranged. The Substrate lift 4 comprising pins 4 arranged on a common pin holder 40. In the exact loading position, the turntable 2 and the substrate carrier unit 3 are arranged and oriented as such that the pins 40 can pass through corresponding through holes in the lower table plate 24, the upper table plate 20 and the substrate carrier 34 and lift substrates from or lower substrates onto the substrate carrier 34. The substrates can be provided by or discharged by a transfer module, as shown in FIG. 7. For determining the exact position of the turntable 2, respectively its orientation, a table flag 25 is provided at the circumference of the turntable 2. In the embodiment of FIG. 2, the table flag is arranged on the lower table plate 24 and extends laterally towards the outside, over the circumference of the lower table plate 24. The table flag 25 comprising at least one slot, which, together with an optical sensor, allows the exact determination of the orientation of the turntable 2.

Figure 3:
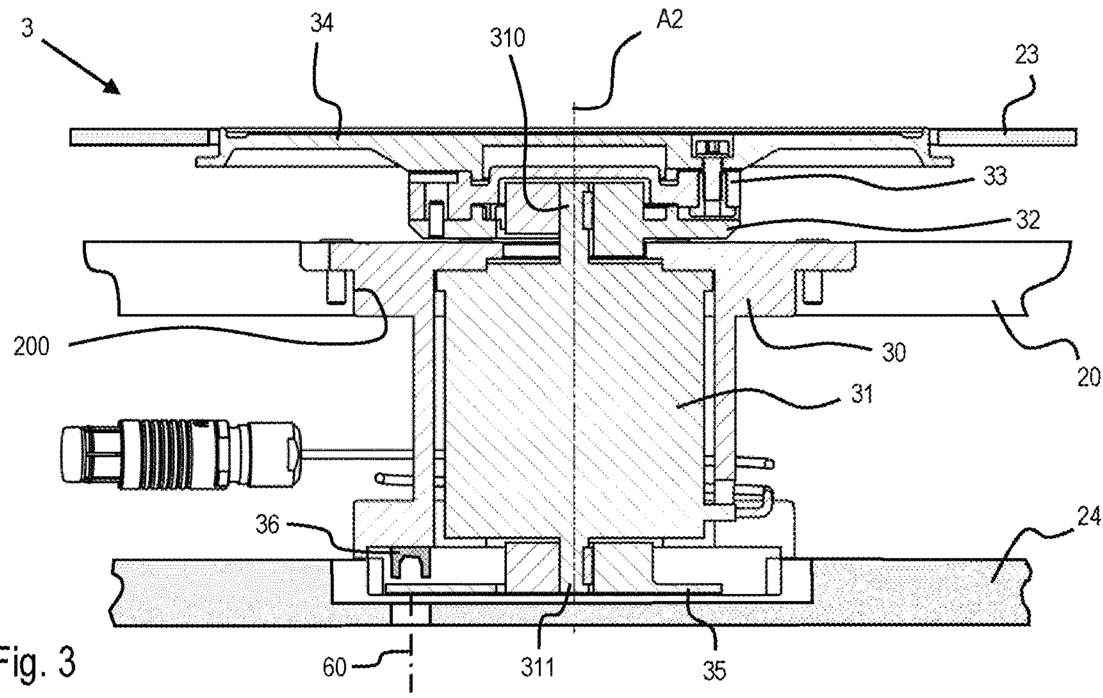
FIG. 3 a cross-sectional view of the substrate carrier unit of FIG. 1.

FIG. 3 shows a cross-sectional view of the substrate carrier unit 3 of FIG. 1. The substrate carrier unit 3 comprises a housing 30, in which a substrate drive 31 is arranged. The housing 30 comprises a flange, which is arranged in a corresponding opening 200 in the upper table plate 20. The upper surface of the flange being essentially flush with the upper surface of the upper table plate 20. The orientation of the housing 30 and thus the substrate drive 31 is as such that the second axis of rotation A2 extends perpendicular to the upper table plate 20. The substrate drive 31 comprises a first shaft 310, which extends along the second axis A2 over the upper surface of the housing 30. A mounting flange 32 is arranged on the first shaft 31. The mounting flange 32 is disk-shaped and can be moved along the second axis A2 and can be fixated on the first shaft by fixation means, for example by a fixation screw. A disk-shaped insulator 33 is arranged on the mounting flange 32. The substrate carrier 34 is arranged on the insulator 33. The insulator 33 is a thermal insulator comprising a material with a low heat conductivity and thus reduces the thermal load on the mounting flange 32. On the top side of the substrate carrier 34 there are elevations for supporting a substrate or for holding the substrate in place. The elevations can be punctual, linear or areal. For example, such elevations can be ridges. A circumferential ridge can prevent a lateral movement of the substrate on the substrate carrier 34. The substrate drive 31 comprises a second shaft 311 on its side opposite to the first shaft 310. The second shaft 311 is rotatable around the second axis A2. A disk-shaped drive flag 35 is arranged on the second shaft 311. The drive flag 35 comprises at least one slot, extending over a part of a circumferential area of the drive flag 35. In the area of the at least one slot, a reflector 36 is arranged on the housing 30, on the side of the drive flag 35 facing the substrate carrier 34. The lower table plate 24 is arranged below the drive flag 35. A through hole is formed in the lower table plate 24, aligned with the reflector 36. The reflector 36 of each substrate carrier unit 3 is arranged as such that in a plane perpendicular to the first axis A1, the connection line between the first Axis A1 and the second Axis A2 is essentially perpendicular to the connection line between the second Axis A2 and the reflector 36.

Figure 4:
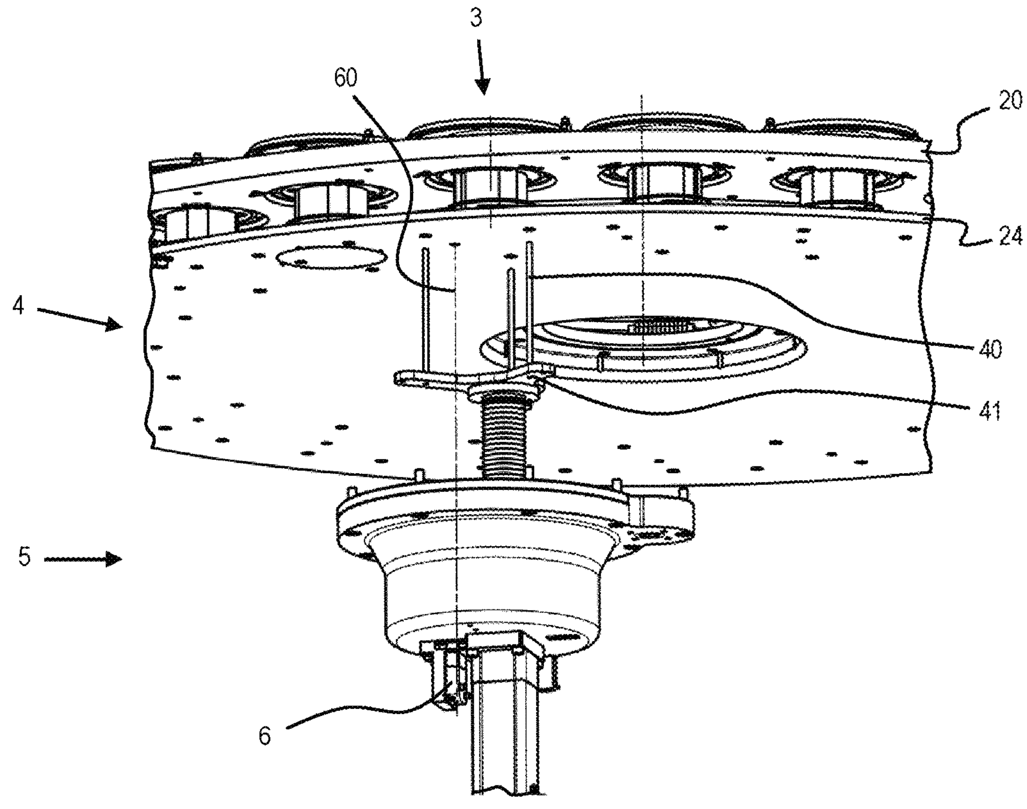
FIG. 4 a perspective explosion view from below of the loading position of the apparatus of FIG. 1.

FIG. 4 shows a perspective explosion view from below of the loading position of the apparatus 1 of FIG. 1. One substrate carrier unit 3 is aligned with the substrate lift 4, the lifter 5 and a position sensor 6 of the loading position. Before lifting, the upper tip of the pins 40 are located below the lower table plate 24 of the turntable 2. The pin holder 41, holding all pins 40 is connected to the lifter 5, which, upon activation, can lift the pins 40 in a vertical direction and towards the substrate carrier unit 3. The position sensor 6 can emit a laser beam 60, which, in the loading position can pass through the through hole in the lower table plate 24 and depending on the position of the slot in the drive flag 35, can reach the reflector 36 of the substrate carrier unit 3. For aligning a specific substrate carrier unit 3 in the loading position, the turntable 2 can be rotated until the specific substrate carrier unit 3 is in the loading position. This can be done by a position sensor together with the table flag 25 or by an encoder of the table drive 22. Subsequently, the substrate carrier 34 is rotated until the position sensor 6 together with the drive flag 36 indicates the correct orientation of the substrate carrier 34. Thereafter, the substrate lift 4 can be activated for loading or unloading a substrate on the respective carrier 34.

Figure 5:
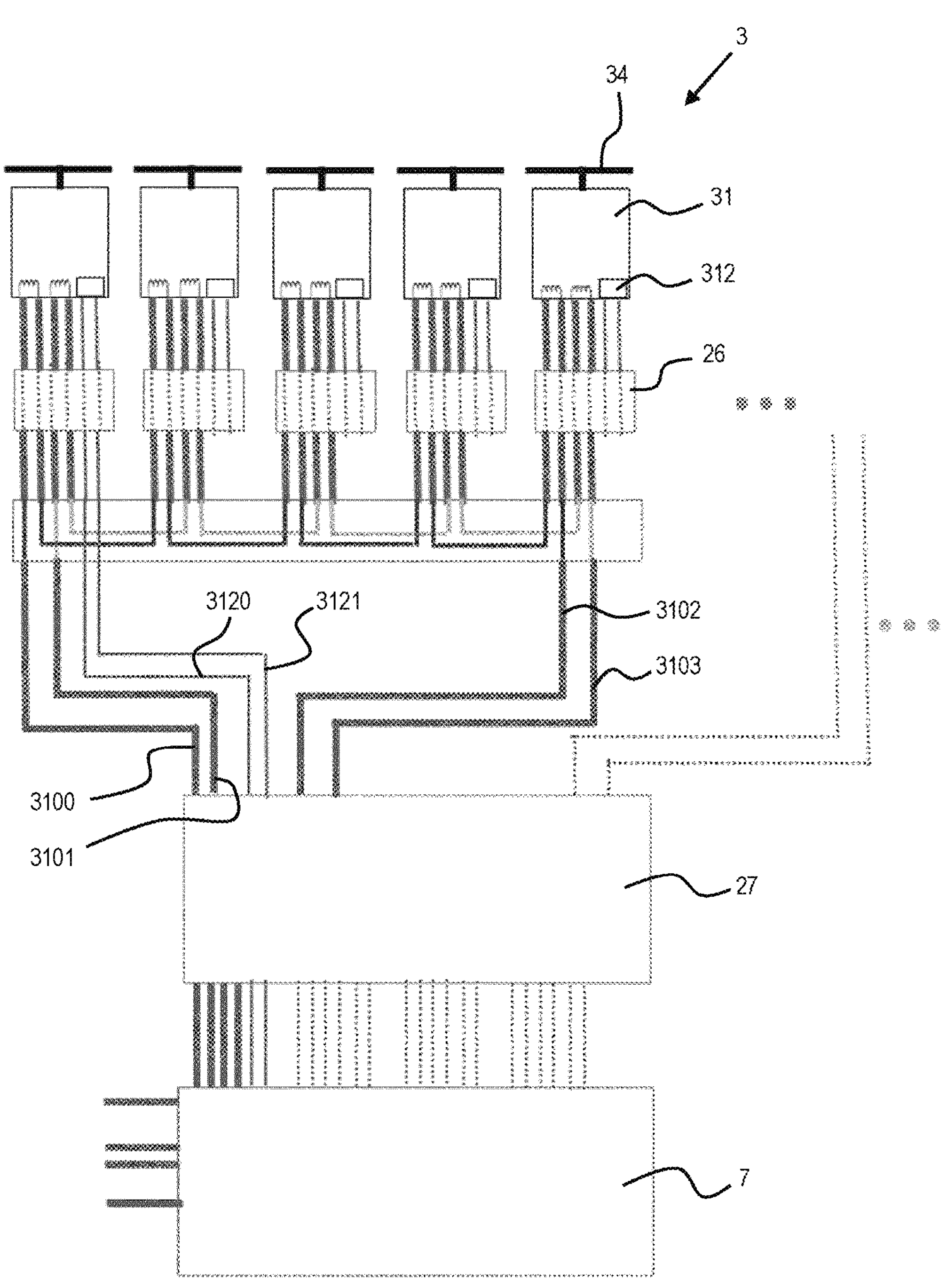
FIG. 5 a schematic connection plan of substrate support units of FIG. 1.

FIG. 5 shows a schematic connection plan of substrate support units 3 of FIG. 1. In the depicted embodiment, five substrate drives 31 are bundled together in a unit. Each drive 31 comprising a first coil, a second coil and an integrated temperature sensor 312. Each drive is connected to the control unit 7 by an individual vacuum feedthrough 26 and a common rotary feedthrough 27. The first coil being connected to an input line 3100 and an output line 3102 and the second coil being connected to an input line 3101 and an output line 3103. As the drives 31 are connected in series, the input lines of the subsequent drive correspond to the output lines of the preceding drive. When electricity flows through the lines, all the drives rotate in sync with each other. Additionally, the number of lines is reduced to two input lines and two output lines. The temperature sensor is connected to an input line 3120 and an output line 3121. For each unit, only the temperature sensor 312 of one drive 31 is connected to the control unit. Thus, for each unit, only the four electric lines related to the drives and the two electric lines related to the temperature sensor 312 need to pass the rotary feedthrough 27.

Figure 6:
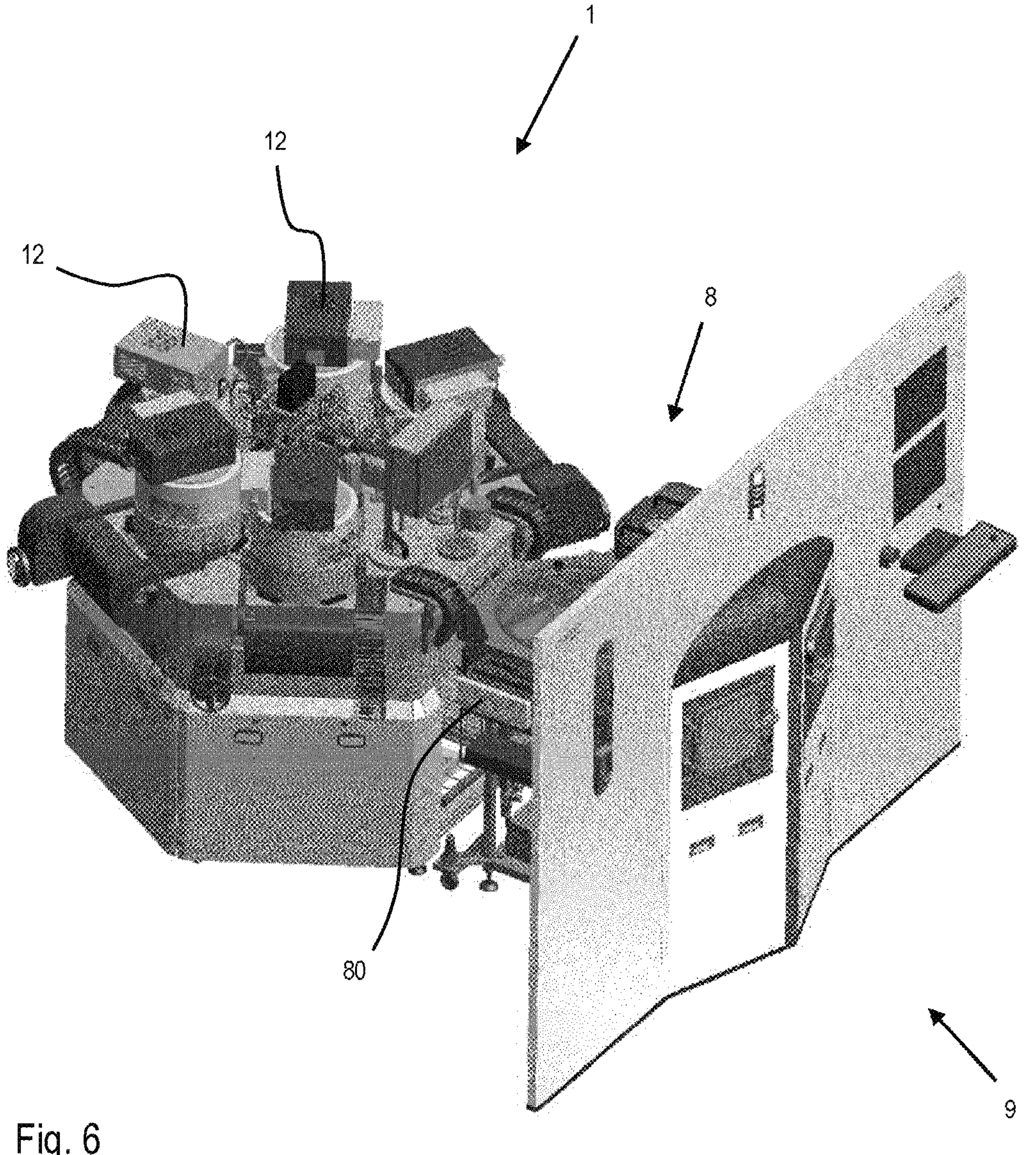
FIG. 6 a perspective view from above of a complete system for depositing a thin film on a substrate with the apparatus of FIG. 1.

FIG. 6 shows a perspective view from above of a complete system for depositing a thin film on a substrate with the apparatus 1 of FIG. 1. On the top side of the apparatus 1 several sources 12 are arranged on a circumference. Adjacent to the loading position, a transfer module 8 is arranged. The transfer module 8 is sealingly connected to the apparatus 1, respectively, the inside of the transfer module 8 is connected to the process chamber of the apparatus 1. The transfer module 8 comprising an aligner 80 for orienting the substrates to be coated in a predefined orientation. Adjacent to the transfer module 8, on the opposite side of the apparatus 1, a loading module 9 is arranged. The loading module 9 is sealingly connected to the transfer module 8. The loading module 9, in the depicted embodiment comprises two loading stations, at which, substrates to be coated can be loaded, single or in batches.

REFERENCE SIGNS LIST

| | | | |
|---|---|---|---|
| 1 | apparatus | 3101 | second supply line |
| 10 | housing | 3102 | first return line |
| 11 | process chamber | 3103 | second return line |
| 12 | source | 3120 | supply line |
| 2 | turntable | 3121 | return line |
| 20 | upper table plate | 32 | mounting flange |
| 200 | opening | 33 | insulator |
| 201 | cover | 34 | substrate carrier |
| 21 | table shaft | 35 | drive flag |
| 210 | bearing | 36 | reflector |
| 22 | table drive | 4 | substrate lift |
| 23 | upper shield | 40 | pin |
| 24 | lower table plate | 41 | pin holder |
| 25 | table flag | 5 | lifter |
| 26 | vacuum feedthrough | 6 | position sensor |
| 27 | rotary feedthrough | 60 | laser beam |
| 3 | substrate carrier unit | 7 | control unit |
| | | 8 | transfer module |
| 30 | housing | 80 | aligner |
| 31 | substrate drive | 9 | loading module |
| 310 | first shaft | | |
| 311 | second shaft | A1 | first axis |
| 312 | temperature sensor | A2 | second axis |
| 3100 | first supply line | | |

What is claimed is:

1. A substrate support unit comprising:

a driver;

a turntable which is rotatable around a first axis and which is driven by the driver; and a plurality of substrate carrier units arranged concentric to the first axis on the turntable, each of the plurality of substrate carrier units comprising a motor and a substrate carrier which is rotatable around a corresponding second axis and which is driven by the motor, wherein all second axes are parallel to the first axis, wherein the turntable comprises a disk-shaped upper table plate with a plurality of holes, wherein each hole of the plurality of holes receives one substrate carrier unit, wherein each hole of the plurality of holes is arranged concentric to the first axis, and wherein each substrate carrier unit comprises a housing in which the motor is received and with which each substrate carrier unit is arranged in a corresponding hole of the turntable.

2. The substrate support unit according to claim 1, wherein the motor is vacuum suitable.

3. The substrate support unit according to claim 1, wherein the driver and/or the motor is a stepper motor.

4. The substrate support unit according to claim 1, wherein the motor comprises a shaft, a mounting flange is arranged slidably along the second axis on the shaft of the motor, wherein the first-shaft protrudes a top surface of the housing, wherein the top surface of the housing extends perpendicular to the first-shaft and is essentially flush with a top surface of the upper table plate.

5. The substrate support unit according to claim 4, wherein an insulator is arranged between the mounting flange and the substrate carrier.

6. The substrate support unit according to claim 1, wherein an upper shield is arranged around the substrate carriers, covering a top surface of the turntable, wherein a top surface of the upper shield is essentially flush with the top surface of the substrate carriers.

7. The substrate support unit according to claim 1, wherein a lower table plate is arranged below the second drives motors extending over the entire circumference of the turntable.

8. The substrate support unit according to claim 1, wherein a substrate lift is arranged at each substrate carrier.

9. The substrate support unit according to claim 8, wherein a lifter is arranged below the turntable at a substrate loading position, the lifter being designed to be able to engage each substrate lift that is allocated in the substrate loading position.

10. The substrate support unit according to claim 1, wherein at least two of the motors are electrically connected in series.

11. The substrate support unit according to claim 10, comprising a controller that is arranged in an atmospheric and static place, wherein each series of motors is connected to the controller by means of a vacuum feedthrough and a rotary feedthrough.

12. The substrate support unit according to claim 10, wherein each motor comprises a temperature sensor and wherein the temperature sensor of one motor of each series of motors is connected to a controller.

13. An apparatus for depositing a thin film on a substrate, comprising:

a process chamber, at least one source on a first side of the process chamber, and a substrate support unit according to claim 1, wherein the substrate support unit defines a second side of the process chamber, opposite to the first side of the process chamber.

14. The apparatus according to claim 13, comprising:

a transfer robot that is arranged at a substrate loading position of the substrate support unit, and at least one loading robot that is arranged at an opposite side of the transfer robot from the substrate support unit.

15. A process for depositing a thin film on a substrate, comprising the steps of:

providing a substrate support unit according to claim 1;

providing a process chamber with at least one source on a first side of the process chamber, wherein the substrate support unit defines a second side of the process chamber, opposite to the first side of the process chamber;

arranging one of the substrate carrier units in a substrate loading position with the driver;

orienting the substrate carrier of said substrate carrier unit in the substrate loading position with the corresponding motor;

loading a substrate on said substrate carrier;

rotating the driver while passing an area of influence of the at least one source for depositing thin film on the substrate or rotating the driver and the motor while passing the area of influence of the at least one source for depositing a non oriented thin film on the loaded substrate.

16. A substrate support unit, comprising:

a driver;

a turntable which is rotatable around a first axis and which is driven by the driver; and a plurality of substrate carrier units arranged concentric to the first axis on the turntable, each of the plurality of substrate carrier units comprising a motor having a first shaft and a second shaft, a housing, and a substrate carrier which is rotatable around a corresponding second axis and which is driven by the motor, wherein all the second axes are parallel to the first axis, wherein a mounting flange is arranged slidably along the second axis on the first shaft of the motor, wherein a position flag is arranged on the second shaft of the motor, wherein the second shaft is colinear to the first shaft and exits the motor on its side opposite to the first shaft, wherein the position flag is disk-shaped, extends beyond a width of the motor and comprises at least one opening that extends over a portion of a circumference of a part of the position flag that extends beyond the width of the motor, and wherein a reflector is arranged in the housing of the substrate carrier unit adjacent to the motor, the reflector is arranged such that in a plane perpendicular to the first axis, a connecting line of the first axis and the corresponding second axis, is essentially perpendicular to a connecting line between the second axis and the reflector, and the reflector faces the position flag.

17. The substrate support unit according to claim 16, wherein a laser sensor is arranged below the turntable at a substrate loading position, is oriented to emit a laser beam parallel to the second axis, and is facing the position flag.

18. A substrate support unit comprising:

a driver;

a turntable which is rotatable around a first axis and which is driven by the driver; and a plurality of substrate carrier units arranged concentric to the first axis on the turntable, each of the plurality of substrate carrier units comprising a motor and a substrate carrier which is rotatable around a corresponding second axis and which is driven by the motor, wherein all second axes are parallel to the first axis, wherein each substrate carrier comprises a circular disk, wherein an upper shield having circular cut-outs, each of the circular cut-outs surrounding a corresponding one of the circular disks, is arranged around the substrate carriers, covering a top surface of the turntable, and wherein a top surface of the upper shield is essentially flush with the top surface of the substrate carriers.

19. A substrate support unit, comprising:

a driver;

a turntable which is rotatable around a first axis and which is driven by the driver;

an optical sensor arranged below the turntable;

a plurality of substrate carrier units arranged concentric to the first axis on the turntable, each of the plurality of substrate carrier units comprising a motor and a substrate carrier which is rotatable around a corresponding second axis and which is driven by the motor, wherein all second axes are parallel to the first axis; and a substrate lift comprising pins and a lifter, wherein each substrate carrier unit comprises a housing and a reflector arranged in the housing in which the motor is received, with which each substrate carrier unit is arranged in a corresponding hole of the turntable, wherein a position flag is arranged on the shaft of the motor, wherein in a loading position in order to lift substrates from or lower substrates onto the substrate carrier, the turntable and one of the substrate carrier units are oriented such that the pins can pass through corresponding through holes in a table plate and the substrate carrier, and wherein the position flag together with the reflector and the optical sensor allow for determination of the orientation.

* * * * *